US012184264B2

(12) United States Patent
Ylilammi et al.

(10) Patent No.: US 12,184,264 B2
(45) Date of Patent: Dec. 31, 2024

(54) TWO-STAGE LATERAL BULK ACOUSTIC WAVE FILTER WITH CAPACITIVE COUPLING OF COUNTER ELECTRODE

(71) Applicant: VTT TECHNICAL RESEARCH CENTRE OF FINLAND LTD., Espoo (FI)

(72) Inventors: Markku Ylilammi, Espoo (FI); Tapani Makkonen, Espoo (FI)

(73) Assignee: VTT Technical Research Centre of Finland Ltd, Espoo (FI)

( * ) Notice: Subject to any disclaimer, the term of this patent is extended or adjusted under 35 U.S.C. 154(b) by 321 days.

(21) Appl. No.: 17/771,301

(22) PCT Filed: Oct. 22, 2020

(86) PCT No.: PCT/EP2020/079841
§ 371 (c)(1),
(2) Date: Apr. 22, 2022

(87) PCT Pub. No.: WO2021/078917
PCT Pub. Date: Apr. 29, 2021

(65) Prior Publication Data
US 2022/0393661 A1    Dec. 8, 2022

Related U.S. Application Data

(60) Provisional application No. 62/924,349, filed on Oct. 22, 2019.

(51) Int. Cl.
*H03H 9/13* (2006.01)
*H03H 9/02* (2006.01)
(Continued)

(52) U.S. Cl.
CPC ............ *H03H 9/13* (2013.01); *H03H 9/0211* (2013.01); *H03H 9/17* (2013.01); *H03H 9/52* (2013.01)

(58) Field of Classification Search
CPC .......... H03H 9/13; H03H 9/0211; H03H 9/17; H03H 9/52; H03H 9/02228; H03H 9/132;
(Continued)

(56) References Cited

U.S. PATENT DOCUMENTS

| 10,790,801 B2 * | 9/2020 | Makkonen ............. H03H 9/132 |
| 11,290,083 B2 * | 3/2022 | Makkonen ............. H03H 9/173 |

(Continued)

FOREIGN PATENT DOCUMENTS

| CN | 112673568 B  * | 9/2023 | ......... H03H 9/02228 |
| JP | 2002198776 | 7/2002 | |

(Continued)

OTHER PUBLICATIONS

Fattinger et al. "Optimization of Acoustic Dispersion for High Performance Thin Film BAW Resonators," 2005 IEEE Ultrasonics Symposium, 2005, 1175-1178.
(Continued)

*Primary Examiner* — Daniel Pihulic
(74) *Attorney, Agent, or Firm* — Fish & Richardson P.C.

(57) ABSTRACT

An acoustic wave filter device with two-stage acoustic wave filters is provided. Each of the two stages includes a respective acoustic wave filter element. A first acoustic wave filter element (100a) includes a first input electrode (150a), a first output electrode (174a), and a first counter electrode (120a). The first input electrode and the first output electrode are located on a top surface of piezoelectric layer (650), and the first counter electrode is located on a bottom surface of the piezoelectric layer. A second acoustic wave filter element (100b) includes a second input electrode (154b), a second output electrode (174b), and a second counter electrode (120b). The second input electrode and the second output electrode are located on the top surface of the piezoelectric layer, and the second counter electrode is located on a (Continued)

bottom surface of the piezoelectric layer. The two acoustic wave filter elements are connected in series through a common floating electrode (602).

13 Claims, 11 Drawing Sheets

(51) Int. Cl.
*H03H 9/17* (2006.01)
*H03H 9/52* (2006.01)

(58) Field of Classification Search
CPC ........ H03H 9/173; H03H 9/175; H03H 9/564; H03H 9/177
See application file for complete search history.

(56) References Cited

U.S. PATENT DOCUMENTS

| | | | |
|---|---|---|---|
| 2010/0039000 A1 | 2/2010 | Milson et al. | |
| 2013/0021305 A1 | 1/2013 | Zuo et al. | |
| 2020/0083862 A1* | 3/2020 | Makkonen | H03H 9/173 |
| 2021/0036677 A1* | 2/2021 | Makkonen | H03H 9/564 |
| 2021/0075401 A1* | 3/2021 | Makkonen | H03H 9/568 |
| 2022/0216852 A1* | 7/2022 | Makkonen | H03H 9/568 |
| 2022/0393661 A1* | 12/2022 | Ylilammi | H03H 9/175 |

FOREIGN PATENT DOCUMENTS

| | | | | |
|---|---|---|---|---|
| WO | WO-2020049170 A1 * | 3/2020 | ......... | H03H 9/02228 |
| WO | WO-2021078917 A1 * | 4/2021 | ........... | H03H 9/0211 |

OTHER PUBLICATIONS

International Preliminary Report on Patentability in International Appln. No. PCT/EP2020/079841, mailed on Apr. 26, 2022, 9 pages.
International Search Report and Written Opinion in International Appln. No. PCT/EP2020/079841, mailed on Aug. 2, 2021, 13 pages.
Meltaus et al., "Laterally Coupled BAW Filter using Two Acoustic Modes," 2013 IEEE International Ultrasonics Symposium (IUS), 2013, 232-235.
Meltaus et al., "Laterally Coupled BAW Filters with 5% Bandwidth," 2010 IEEE International Ultrasonics Symposium, 2010, 966-969.
Meltaus et al., "Laterally coupled solidly mounted BAW resonators at 1.9 GHz," 2009 IEEE International Ultrasonics Symposium, 2009, 847-850.
Pensala et al., "2-D Modeling of Laterally Acoustically Coupled Thin Film Bulk Acoustic Wave Resonator Filters," IEEE Transactions on Ultrasonics, Ferroelectrics, and Frequency Control, Nov. 2010, 57(11):2537-2549.
Piazza et al., "One and two port piezoelectric higher order contour-mode MEMS resonators for mechanical signal processing," Solid-State Electronics, 51(11-12):1596-1608.
Wang et al., "FBAR Laterally Coupled Resonator Filter," 2015 IEEE International Ultrasonics Symposium (IUS), 2015, 5 pages.

* cited by examiner

TWO-STAGE LATERAL BULK ACOUSTIC WAVE FILTER WITH CAPACITIVE COUPLING OF COUNTER ELECTRODE

BACKGROUND

Technical Field

This specification relates to thin film radio-frequency acoustic wave filters.

Background

Radio-frequency ("RF") components, such as resonators and filters, based on microacoustic and thin-film technology are widely used in radio applications such as: mobile phones, wireless networks, satellite positioning, etc. Their advantages over their lumped-element, ceramic, and electromagnetic counterparts include small size and mass-production capability.

SUMMARY

This specification describes technologies for band pass Lateral Bulk Acoustic Wave ("LBAW") filters. More particularly, the present disclosure provides techniques to suppress sidebands in LBAW filters and improve band pass filter characteristic of LBAW filters.

LBAWs can be used as band pass filters. The band pass filter may include one or more undesired (or parasitic) sidebands. Implementations of the present disclosure provide techniques to suppress the undesired sidebands by cascading two or more LBAWs.

LBAW filters are formed from a piezoelectric layer sandwiched between two pairs of electrodes. One electrode from each pair is located on the top surface of the piezoelectric layer, and forms an input or an output of the LBAW. The input and output electrodes are separated by a gap. Each pair also has a counter electrode located on the bottom surface of the piezoelectric layer. By applying an alternating voltage across the piezoelectric layer at the input resonator, a mechanical resonance is formed in the piezoelectric layer below the input electrode. The piezoelectric layer thickness and the gap between electrodes can be designed such that this mechanical resonance is coupled across the gap to the output resonator. The frequency range at which such coupling occurs determines the achievable bandwidth (or width of passband) for the LBAW filter.

In general, one innovative aspect of the subject matter described in this specification can be embodied as an acoustic wave filter that includes a first acoustic wave element, a second acoustic wave filter element, and a common electrode. The first acoustic wave filter element includes a first input electrode, a first output electrode, and a first counter electrode. The first input and the first output electrodes are located on a top surface of a piezoelectric layer, and the first counter electrode is located on a bottom surface of the piezoelectric layer. The second acoustic wave filter element includes a second input electrode, a second output electrode, and a second counter electrode. The second input and the second output electrodes are located on the top surface of the piezoelectric layer, and the second counter electrode is located on a bottom surface of the piezoelectric layer. The second counter electrode is electrically separated from the first counter electrode. The common electrode electrically connects the first output electrode to the second input electrode.

The subject matter described in this specification can be implemented in particular embodiments so as to realize one or more of the following advantages. The stop band rejection of an LBAW filter can be improved by connecting two filters in series. The band pass response of the filter can be improved, e.g., by suppressing spurious transmission peaks. The suppression can be achieved at particular frequencies or over a range of frequencies.

In addition, LBAW filters described herein can be simpler to fabricate as compared to conventional acoustic filters because an LBAW uses only a single piezoelectric layer as compared to two vertically stacked bulk acoustic wave (BAW) coupled resonator filters. The LBAW filters can also operate at higher frequencies as compared to surface acoustic wave (SAW) filters because the LBAW filter operation is determined more by piezoelectric layer thickness than interdigital transducer (IDT) electrode dimensions. In some embodiments, LBAW filters can also achieve a wider bandwidth than BAW filters. LBAW filters can perform as filters with a single lithographic patterning step as compared to close to 10 in BAW and can operate without reflectors needed in SAW, and thus in smaller size.

The details of one or more embodiments of the subject matter of this specification are set forth in the accompanying drawings and the description below. Other features, aspects, and advantages of the subject matter will become apparent from the description, the drawings, and the claims.

DETAILED DESCRIPTION

Figure 1A:
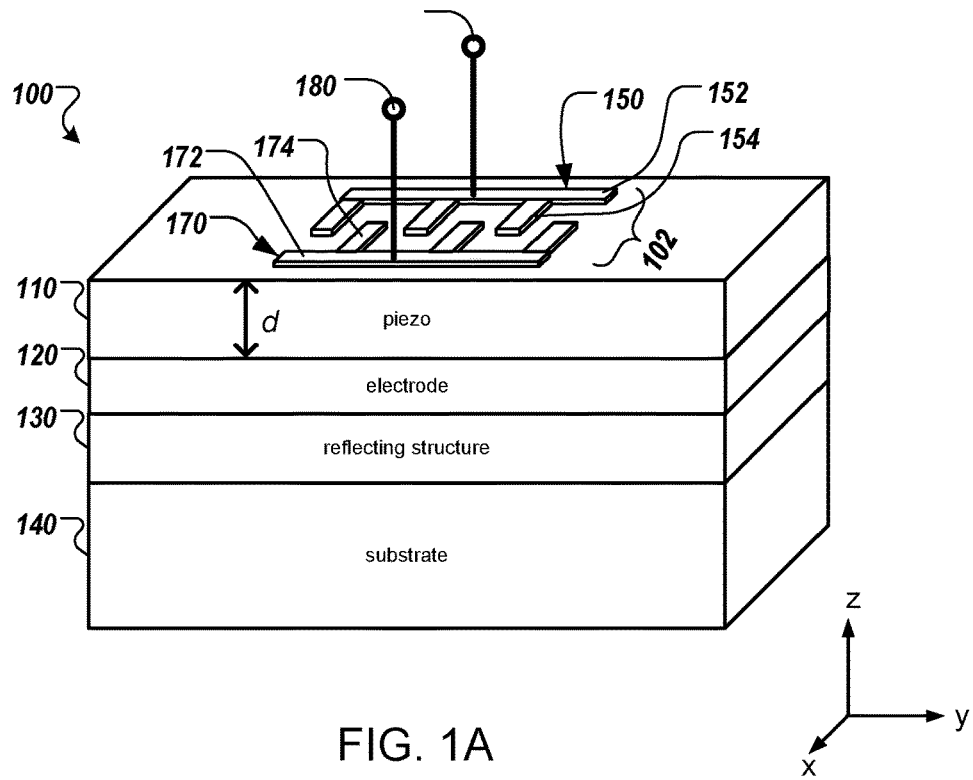
FIG. 1A is a schematic perspective view of a solidly-mounted LBAW filter.
Figure 1B:
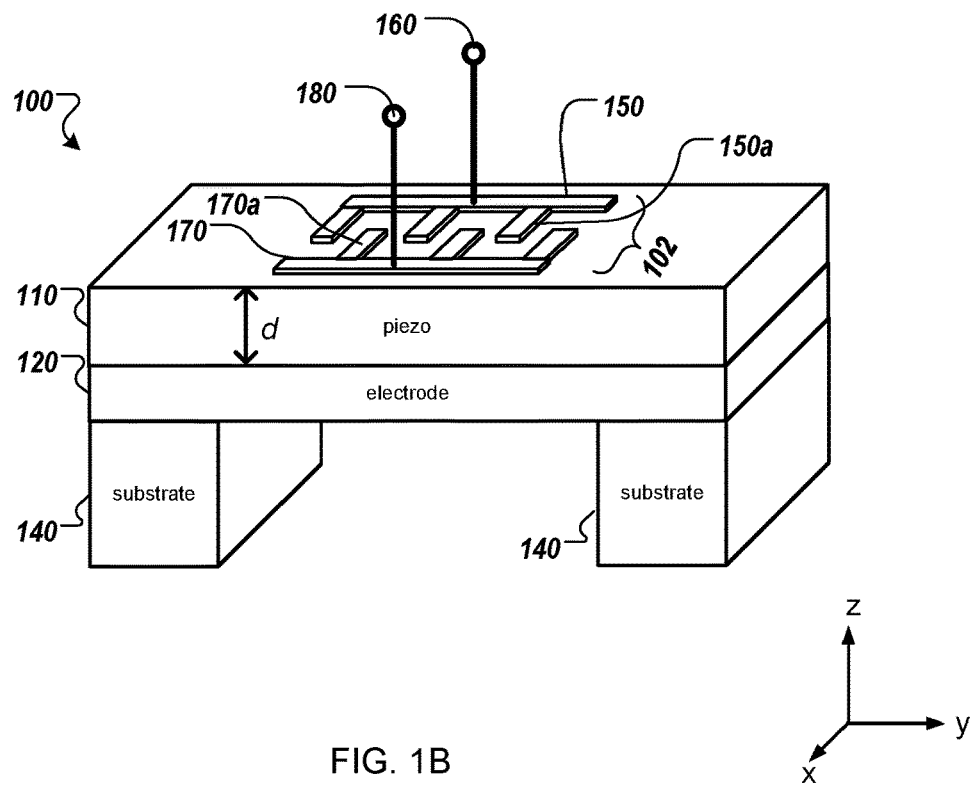
FIG. 1B is a schematic perspective view of a self-supported LBAW filter.
Figure 1C:
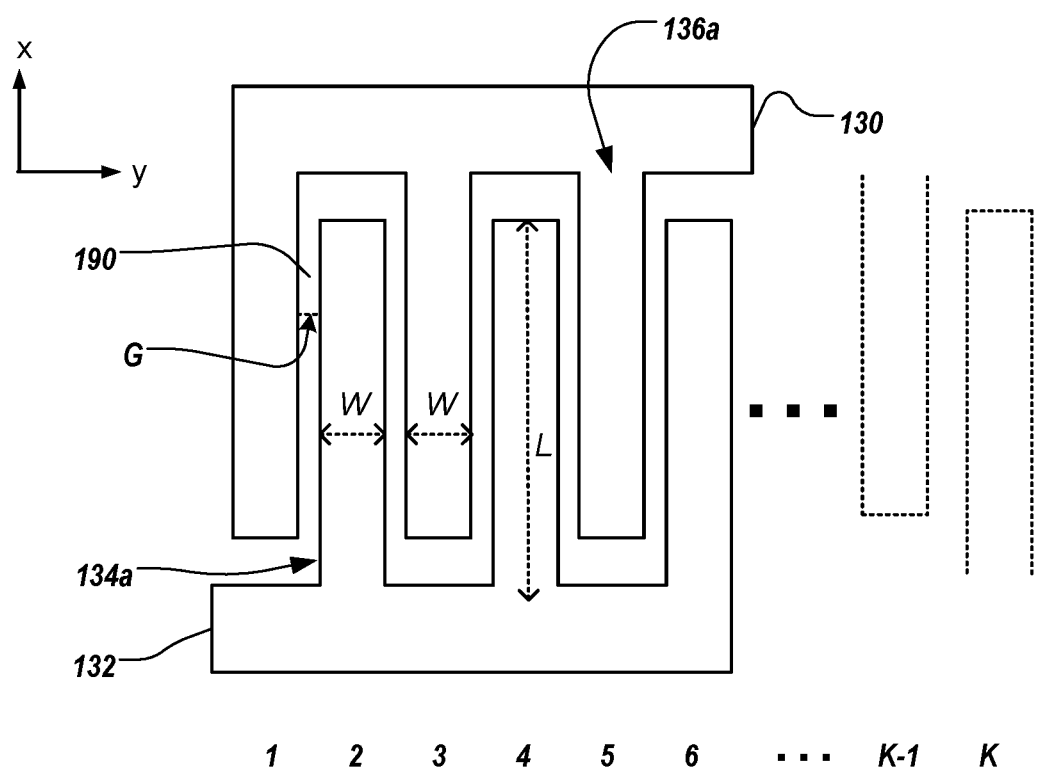
FIG. 1C is a schematic planar view of an IDT electrode structure.

FIGS. 1A, 1C show an example of an LBAW filter (or resonator) 100 with input 150 and output 170 electrodes that have an interdigitated geometry (also called "interdigital transducer" or "IDT" LBAW). LBAW filter 100 includes a piezoelectric ("piezo") layer 110, having a thickness d, an IDT electrode structure 102 located on the top surface of the piezo layer, and a bottom counter electrode 120 located on the bottom surface of the piezo layer. IDT electrode structure ("IDT") 102 includes two comb-shaped electrodes, 150 and 170, of conductive material, e.g., metal or polysilicon. IDT electrodes 150 and 170 have parallel extensions 154 and 174, respectively, that project from a common electrode base region 152 and 172, respectively, and that provide the "tines" or "teeth" or "fingers" of the "comb." Electrode 150 and counter electrode 120 form an input resonator with piezo layer 110. Electrode 170 and counter electrode 120 form an output resonator with piezo layer 110.

Acoustic vibrations are created in piezo layer 110 by applying an oscillating (or alternating) input voltage across IDT electrode 150 and bottom counter electrode 120 at an input port 160. The applied voltage is transformed into a mechanical (e.g., acoustic) vibration via the piezoelectric effect. Under resonance conditions (e.g., with certain acoustic resonance modes, as detailed further below), this vibration can create a standing wave under input electrode 150 and an evanescent wave (with exponentially decaying amplitude) in the gap region 190. With appropriate selection of vibration frequencies and gap width G, the standing wave can be coupled mechanically across gap 190 from the piezo region under electrode 150 to piezo region under electrode 170 by the evanescent wave and create a similar standing wave in piezo layer 110 under electrode 170. The standing wave under electrode 170 results in an output signal voltage with the same frequency at an output port 180 via the reverse piezoelectric effect. The frequency range at which this coupling occurs in mechanical resonance with strong piezoelectric coupling forms the passband (or bandwidth) of LBAW filter 100. In some example, the frequency range is between 1.8 and 1.95 GHz. As discussed further below, the thicknesses and geometries, and spacing of the various layers of LBAW 100 can be tuned to change the RF response and passband of the filter. Throughout this disclosure, width and length are measured along axes parallel to the piezoelectric layer and thickness is measured along the axis perpendicular to the piezoelectric layer.

A reflecting structure 130 can serve to isolate the vibration in piezo layer 110 from an underlying substrate 140 and to prevent acoustic leakage. The reflecting structure can be a stack of thin layers, for example, a Bragg reflector composed of alternating high and low acoustic impedance ("$Z_{ac}$") material layers. The thickness of these layers can be designed such that the frequencies with and near the passband of LBAW filter are reflected back into piezo layer 110 and all other frequencies pass through the mirror.

In some embodiments, LBAW 100 does not directly overlie substrate 140 (as shown in FIG. 1A), but is self-supported, as shown in FIG. 1B. In such an arrangement, substrate 140 and mirror 130 are replaced by an air gap, with portions of piezo that extend laterally past the region in which LBAW 100 is fabricated being supported by substrate 140.

In some embodiments, as shown in FIG. 1C, extensions 150a and 170a are rectangular and have a width W, length L, and are spaced by gap width G. Each electrode 150 and 170 has one or more extensions 150a and 170a respectively. The total number of electrode extensions is designated as K.

Although FIG. 1C shows rectangular interdigital electrodes 150/170 with parallel extensions 154/174 of same geometry and spacing G, other electrode geometries are also contemplated. Design considerations include the gap between electrodes, the length of the electrode, and the number, if any, and shape of electrode extensions. The gap can be used to control coupling between the input and output electrodes. Longer electrodes can also increase coupling. The number of extensions K can be used to control the bandwidth and/or to increase coupling while conserving the area taken up by the electrodes. In some embodiments, the electrodes are composed of rectangular strips, with two or more extensions (e.g., K≥2). For example, each extension can be a rectangular strip. In some embodiments, the electrodes are concentric circles or spirals having a common axis.

Piezo layer 110 can be formed from various piezoelectric materials. Exemplary materials include ZnO, AlN, CdS, PZT, $LiNbO_3$, $LiTaO_3$, quartz, KNN, BST, GaN, Sc alloyed AlN, or the aforementioned materials doped or alloyed with an additional element. Doping can be used to improve or tailor electromechanical properties of piezo layer 110. As detailed further below, piezo layer thickness d is selected such that thickness-extensional modes near the frequencies of the desired bandwidth of the LBAW filter are produced in the piezo layer. In some embodiments, piezo layer thickness d is 20% to 50% of $\lambda_z$, or 30% to 45% of $\lambda_z$, where $\lambda_z$ is the wavelength of the piezoelectric vibration in the thickness direction. In some embodiments, d is 1500 nm to 2500 nm, or 1800 to 2200 nm.

Thin film IDT 102 can be composed of various materials. In some embodiments, IDT electrodes 150 and 170 are metal. For example, the electrode material can include Al, Mo, Pt, Cu, Au, Ag, Ti, W, Ir, Ru, or multilayers of metals and/or metals doped with additional materials, e.g. AlSi, AlSiCu, polysilicon, etc. Doping can be used to improve or tailor IDT electric or mechanical properties.

Although FIG. 1A shows a single common counter electrode 120, filter 100 can include separate electrodes for the input and output resonators. Various materials are suitable for the counter electrode(s) (e.g., electrode 120). For example, the electrodes can include a metal, such as Al, Mo, Pt, Cu, Au, Ag, Ti, W, Ir, Ru, or multilayers of metals and/or metals doped with additional materials, e.g. AlSi, AlSiCu etc. Doping can be used to improve or tailor IDT electric or mechanical properties. For example, the electrodes can be Ti+Mo, Ti+W, AlN+Mo, or Al+W. The electrodes can be multilayered. The electrodes can have a special thin seed layer deposited below the electrode.

Reflecting structure 130 can be composed of alternating layers of different materials. For example, reflecting structure 130 can include alternating layers of two of: tungsten (W), $SiO_2$, silicon (Si), and carbon (C). For example, layers of high acoustic impedance include W, Mo, Ir, $Al_2O_3$, diamond, Pt, AlN, $Si_3N4$. Layers of low acoustic impedance can include $SiO_2$, glass, Al, Ti, C, polymers, or porous materials. Layer of Si provides an intermediate acoustic impedance. Various materials are suitable for the substrate 140, such as Si or $SiO_2$ or glass, sapphire, quartz. Substrate 140 materials can have high electrical resistivity. The substrate can have a thickness appropriate for RF applications, such as integration into mobile phone platforms. For example, the substrate can have a thickness less than 500 microns, or less than 200 microns. For example, Si wafers can be purchased with a thickness of 675 µm and thinned down to a achieve desired device thickness, e.g., for mobile platforms.

Modeling of the acoustic response of LBAW 100 can provide guidance on how to tune the design parameters for individual elements of the structure to achieve desired bandpass properties. For example, LBAW 100 can be designed to have resonance modes at specific frequencies. In general, the geometry of various LBAW 100 components can be selected to achieve various acoustic properties. LBAW 100 properties can depend on the combination of these geometries, which may not be independent of one another.

Figure 2A:
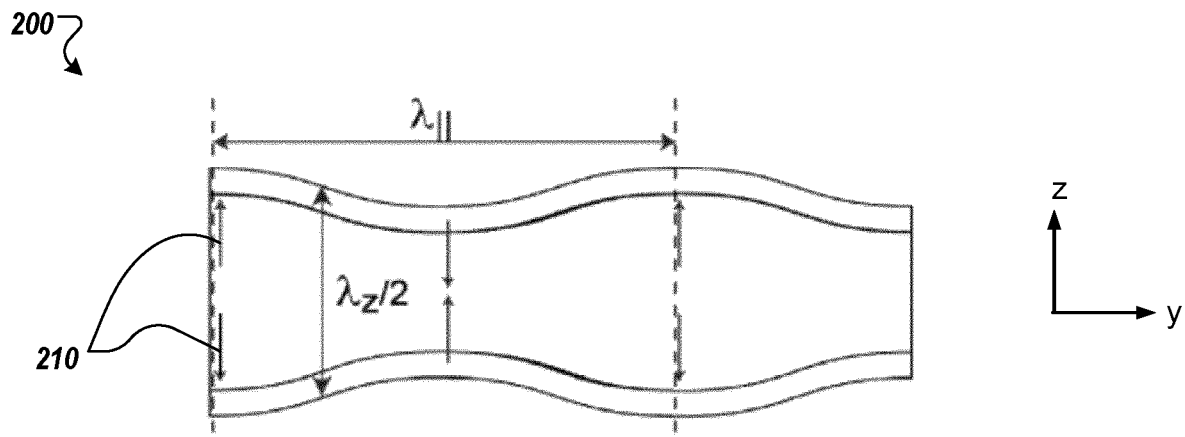
FIGS. 2A-B are schematic diagrams of two types of propagating plate wave modes in LBAW piezo layer.
Figure 2B:
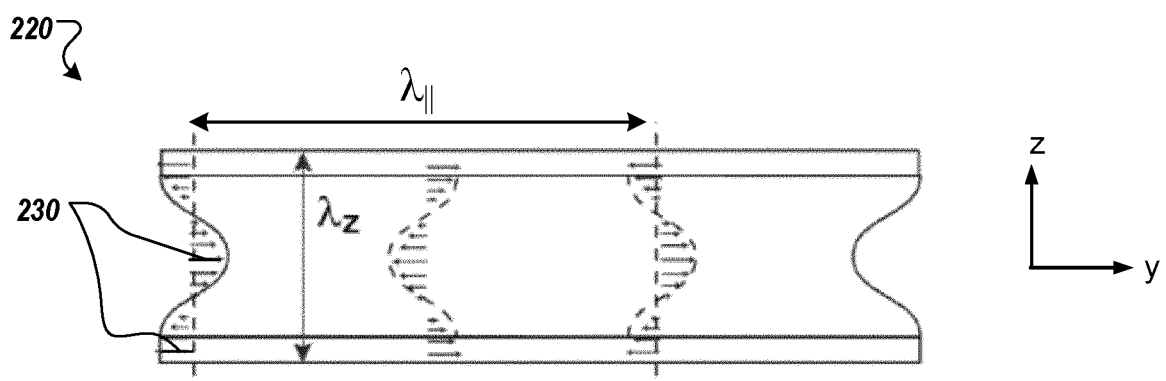

In piezoelectric layer 110, different bulk acoustic vibration modes can arise at different excitation frequencies f of input voltage (e.g., at port 160). Acoustic vibrations in piezo layer 110 can propagate laterally as Lamb waves (or plate waves), wherein particle motion lies in the plane that contains the direction of wave propagation and the plate normal (e.g., the z-axis in FIG. 1A). Two such modes are shown in FIGS. 2A-2B. Referring to FIG. 2A, a thickness-extensional (TE or longitudinal) bulk mode 200 has particle displacement 210 dominantly perpendicular to the propagation direction (in the z-direction). Referring to FIG. 2B, a second order thickness-shear (TS2) bulk mode 220 has particle displacement 230 dominantly parallel to the propagation direction (in the y-direction). For both modes, the lowest frequency at which resonance in the thickness direction can arise is when the thickness d of piezo layer 110 is equal to an integer number of half wavelengths $\lambda_z$ (disregarding the thickness of electrodes 150/170); in other words, when $$d = \frac{N\lambda_z}{2},$$

where N is an integer that indicates the order of the resonance. For the TE1 mode, $$d = \frac{\lambda_z}{2}.$$

As discussed further below, the width W of the electrodes and the gap G between electrodes can be designed such that TE1 mode standing waves with certain lateral wavelengths $\lambda_{81}$ are formed that can couple through their evanescent tails across gap G to create two mechanical resonant modes.

Figure 3:
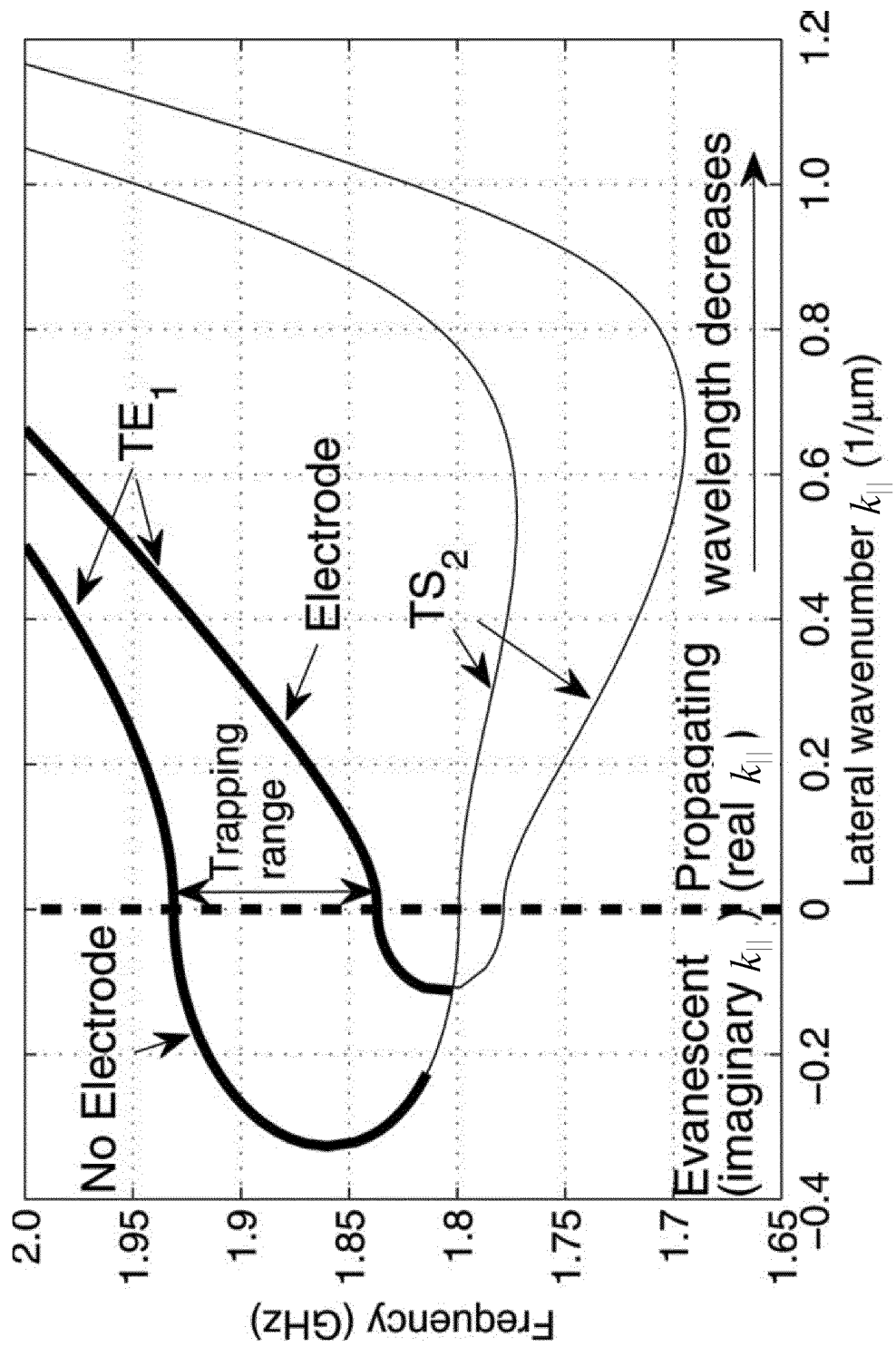
FIG. 3 is a dispersion curves for an exemplary LBAW.

Acoustic properties of an LBAW resonator 100 can be described with dispersion curves. Referring to FIG. 3, an example dispersion curve for an LBAW 100 shows the lateral wave number $k_{81}$ of the vibration, where $$k_\| = \frac{2\pi}{\lambda_\|},$$

as a function of frequency f. The first-order longitudinal (thickness extensional, TE1) vibration mode, in which the combined thickness of the piezoelectric layer d and the thickness of electrode(s) 150 or 170 contains approximately half a wavelength of the bulk vibration, $\lambda_z/2$, and the second-order thickness shear (TS2) mode, in which the bulk vibration is dominantly perpendicular to the thickness direction (z-axis in FIG. 2B) and approximately one acoustic wavelength $\lambda_z$ is contained in the combined piezoelectric layer thickness d and the thickness of electrode(s) 150 or 170, are denoted in the figure. The TE1 mode is the darker portion of each dispersion curve, and TS2 mode is the lighter region of each dispersion curve. The top curve ("no electrode") represents the dispersion properties of the piezoelectric layer under the gap 190. The bottom curve ("electrode") represents the dispersion properties of the piezoelectric layer under electrodes 150/170, also known as the active region. More specifically, where the "electrode" curve intersects k=0, the TE1 mode has approximately $\lambda_z/2$ contained in the combined thickness of the electrodes 150 or 170 and the piezoelectric layer. This is approximate because the wave can extend into the Bragg reflector. "No Electrode" curve intersection with k=0 lines shows the modes where approximately $\lambda_z/2$ is contained in the combined thickness of the bottom electrode only and the piezolayer. This type of dispersion, in which the TE1 mode has increasing $k_\|$ with increasing frequency f, is called Type 1. The difference in intersect $k\|=0$ frequencies between electrode and non-electrode areas determined the hard limits for the achievable bandwidth of the filter. The gap width G, electrode width W, and number of extensions K can be used to vary the coupling strength within the limits set by the dispersion difference.

In some embodiments, LBAW 100 can be designed to produce Type 1 dispersion. For example, piezo layer 110 materials can be selected in which Type 1 dispersion can occur. For example, ZnO can be used. In another example, appropriate design of acoustic Bragg reflector 130 can help achieve Type 1 dispersion. For example, using Aluminum nitride ("AlN") for piezo layer 110 can typically produce a Type 2 dispersion, where TE1 mode behaves non-monotonically having initially decreasing $k_\|$ with increasing frequency f, and then increasing $k_\|$ with increasing frequency f, (roughly similar to what is described in the dispersion curves of in FIG. 3 but with TE1 and TS2 interchanged). However, in some embodiments, with an appropriate design of the reflecting structure 130 (e.g., acoustic Bragg reflectors), the LBAW 100 can use AlN in piezo layer 100 and still achieve a Type 1 dispersion. See for example Fattinger et al. "Optimization of acoustic dispersion for high performance thin film BAW resonators," Proc. IEEE International Ultrasonics Symposium, 2005, pp. 1175-1178.

In FIG. 3, positive values of k‖ denote real wave numbers (propagating waves) and negative k‖ values correspond to imaginary wave numbers (evanescent waves). For a resonance to arise, the acoustic energy must be trapped inside the LBAW resonator structure. In the thickness (z-axis) direction, isolation from the substrate (using reflecting structure 130) can be used for energy trapping. In the lateral direction, energy trapping can occur when an evanescent wave forms outside the electrode region (e.g., on the "no electrode" curve). To get resonant coupling between the two resonators (e.g., electrodes 150/170 and 120) of an LBAW, standing waves of a TE1 mode form in the active regions of the piezo layer (under the electrodes), and evanescent waves form in the "no electrode" region. In other words, k‖ is positive for the TE1 "electrode" curve and negative for the TE1 "no electrode" curve. According to FIG. 3, this occurs in the labeled "trapping range" frequency range. Energy trapping can be easier to realize in Type I dispersion. Without wishing to be bound by theory, with monotonically increasing dispersion curves as the thick TE1 lines in FIG. 3, for the "Electrode", at a single frequency in the trapping range there is either a single imaginary wave number available or above the trapping range a single real wave number. The former means that the TE1 does not propagate outside the electrode and the latter that the TE1 can couple to a propagating wave outside the electrode and thus "leak". The Type 2 dispersion can be described by similar curves but with the TE1 and TS2 curves interchanged. The fact that the curve in Type 2 is non-monotonic means that at a given frequency there may be several real wavenumbers. Having several wavenumbers for a frequency means propagating waves are available outside the electrode, which can cause a "leak".

Figure 4A:
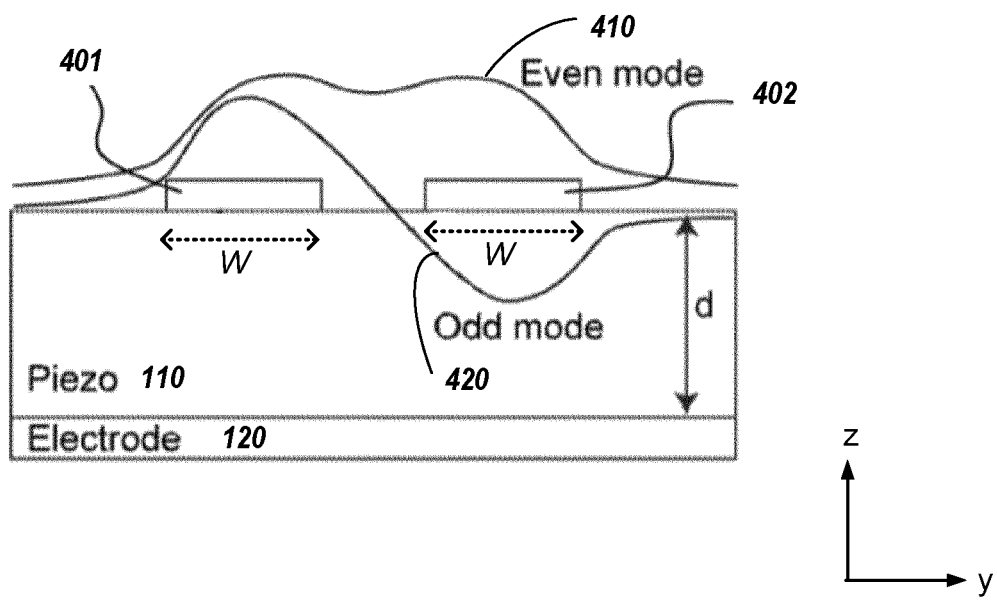
FIG. 4A is a schematic diagram of two resonant modes in an LBAW.
Figure 4B:
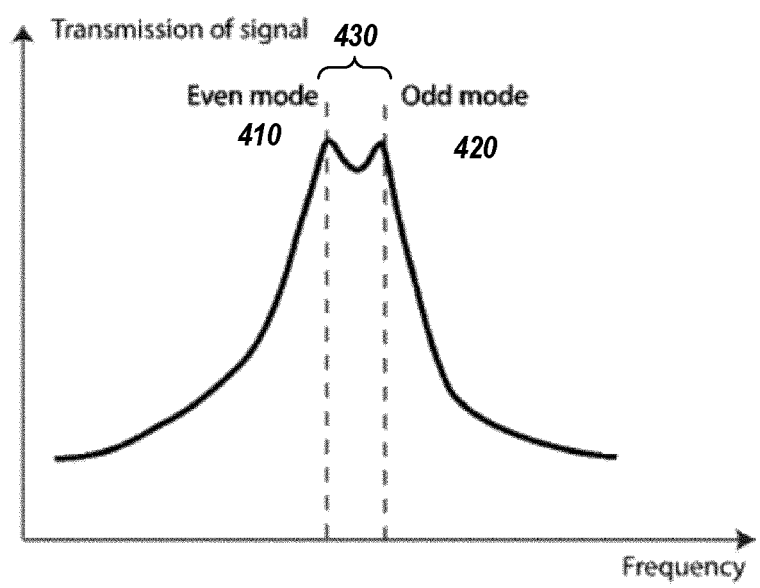
FIG. 4B is an illustrative transmission response of an LBAW as a function of frequency.

FIGS. 4A-4B illustrate the relationship between standing wave resonance modes and the LBAW bandgap. Referring to FIG. 4A, a portion of LBAW 100 includes two adjacent electrodes 401 and 402 with width W (e.g., corresponding to extensions 154 and 174 of respective electrodes 150 and 170 of FIG. 1A). The bandpass frequency response of LBAW 100 is formed by two or more laterally standing resonance modes, 410 and 420, arising in the structure. Lateral standing wave resonance can arise when plate waves are reflected from edges of the adjacent electrodes 401 and 402. In the even mode resonance 410, the piezo layer under both electrodes 150 and 170 vibrates in-phase, whereas in the odd mode resonance 420, the phases are opposite. The even lateral standing wave resonance can arise when the total width of the structure is roughly equal to half of the lateral wavelength $\lambda_\parallel$ of the mode:

$$\frac{\lambda_{even}}{2} = \frac{\lambda_\parallel}{2} \approx 2 \cdot W + G.$$

In the limit of infinitely small gap width G, $\lambda_{even}$ approaches the total width from below. As shown in FIG. 4A, $\lambda_{even}$ gets smaller when G gets larger and gets larger when G gets larger. In case of small gap (e.g., zero-gap) $\lambda_{even}$ gets close to 4W and in case of a large gap $\lambda_{even}$ gets close to 2W. The odd lateral standing wave resonance can arise when the width of the electrode is roughly equal to half of the lateral wavelength $\lambda_\parallel$ of the mode:

$$\frac{\lambda_{odd}}{2} = \frac{\lambda_\parallel}{2} \approx W.$$

Referring to FIG. 4B, the even 410 and odd 420 modes are shown as transmission peaks as a function of input frequency f for an LBAW with Type 1 dispersion. For Type 1 dispersion, the even mode 410 has a longer wavelength and is lower in frequency than the shorter-wavelength odd mode 420. The frequency difference 430 between the modes determines the achievable bandwidth of LBAW filter 100, and depends on the acoustic properties of the structure and on the dimensions of IDT resonator 102. Acoustic coupling strength can be defined in terms of the (resonance) frequency difference between even (symmetric) and odd (antisymmetric) resonances:

$$\frac{f_{asymm} - f_{symm}}{f_0},$$

where $f_{symm}$ and $f_{asymm}$ are the symmetric and antisymmetric eigenfrequencies, respectively, and $f_0 = (f_{symm} + f_{asymm})/2$ is the center frequency between the two modes.

In some embodiments, increasing the number of extensions (e.g., 154 and 174) in each electrode (e.g., 150 and 170) can increase the frequency difference between the even and odd mode in the LBAW, and thus increase the bandwidth. This effect can result from the fact that the lateral wavelength of the odd mode can depend on the periodicity of the electrode structure (e.g., width W), while the even mode can depend on the entire width of the structure (e.g., adding up all widths W and gaps G). For example, if the total number of electrode extensions K, the electrode width is W, and the gap width is G, the wavelength $\lambda_\parallel$ of the lateral acoustic wave at the even mode resonance frequency approaches or is slightly shorter than:

$$\frac{\lambda_{even}}{2} \approx K \cdot W + K \cdot G.$$

The odd lateral standing wave resonance in this structure, however, approaches or is slightly larger than:

$$\frac{\lambda_{odd}}{2} \approx W.$$

Additionally, or alternatively, in some embodiments, the total width of the structure K·W +K·G can be such that the highest-order mode trapped in the structure is the desired odd mode resonance. For example, K can be 31, W can be 3 µm, and G can be 2 µm.

In some embodiments, the number of electrode extensions K is between 2 and 200, or between 10 and 60. In some embodiments, the length L of electrode extensions can be between 50 µm and 2000 µm, or between 70 µm and 500 µm.

In some embodiments, the gap G is selected to allow coupling of the evanescent tails of standing waves formed under electrodes 150 and 170. For example, the gap G between electrode extensions can be 0.1 µm and 10 µm, or between 2 µm and 5 µm.

In some embodiments, the topology of the electrodes 150 and 170 can be designed such that the gap width G provides good enough coupling between electrode extensions to create a single even mode 410 across the entire width of the structure. For example, the gap width G can be 2%-300%, or 10% - 100% of the evanescent acoustic wave's decay length, i.e. the length at which amplitude $A = A_0 \cdot e^{-1}$ of the original amplitude $A_o$, in the gap at the desired even resonance mode. The gap width G can be optimized. Decreasing the gap to a too small width (1) can eventually pull the even and odd modes too far from each other creating a dip in the passband, (2) can lead to reduced coupling coefficient for the odd mode, or (3) can increase capacitive feedthrough from finger to finger causing poor out of band attenuation.

In some embodiments, the gap width G can be defined with respect to piezo layer thickness d. For example, G can be designed to be 10% to 300% of d, or 25% to 150% of d.

In some embodiments, the width of electrode extensions W can be between 0.1 µm and 30 µm, or between 2 µm and 5 µm. In some embodiments, W can be designed such that the wavelength $\lambda_\parallel$ of the lateral acoustic wave at the desired odd mode resonance frequency $\lambda_{odd}$ is obtained.

In some embodiments, the electrode width W is designed such that multiple half-wavelengths cannot fit within the electrode width. For example, W can be designed to be smaller than the lateral acoustic wave's wavelength $\lambda_\parallel$ at the desired odd resonance mode, e.g., where $\lambda_\parallel = \lambda_{odd}$.

In some embodiments, the thicknesses of various LBAW 100 components can be selected to achieve various acoustic properties and may be interdependent. For example, the piezo layer 110 thickness d (minimum and maximum value) can first be determined with respect to the acoustic wavelength in the piezo material (λ) at the operation frequency f. In some embodiments, thicknesses (min and max) of the other LBAW 100 layers can be selected based on the choice of piezo thickness d. For example, the combined thickness of the electrodes (including the counter electrode 120) and the piezoelectric layer can be selected to be approximately half a wavelength of the mode that is being used, for example longitudinal bulk wave for the thickness extensional mode. Fundamental modes with N=1 (the first mode, i.e., first harmonic) can allow for greater coupling, but N>1 modes are also possible. For example, the thickness of electrodes 150 and 170, bottom electrode 120, and reflecting structure 130 can be defined as a percentage of piezo layer thickness d. In some embodiments, once all thicknesses are selected, the geometry of the electrode extensions 150a and 170a, such as number K, width W, and length L, can be tuned to match the LBAW 100 electrical impedance to the system impedance. Without wishing to be bound by theory, impedance matching can help avoid losses and reflections in the system.

In some embodiments, thickness of electrodes 150 and 170 is between 1% to 30% of d, or 5% to 25% of d, or 3% to 15% of d.

In some embodiments, the thickness of bottom electrode 120 is between 5% to 50% of d, or 10% to 30% of d, or 10% to 20% of d.

In some embodiments, where the reflecting structure 130 is a Bragg reflector, the alternative layers of the reflector can be designed such that the required reflectivity of passband wavelengths is obtained. For example, the thickness of each layer can be equal to or less or more than one quarter of the acoustic wavelength $\lambda_z$ in the thickness direction to reflect the odd and even TE1 resonance modes. In some embodiments, a single layer in the Bragg reflector can be 15% to 80% of d, or 20% to 70% of d.

The mass loading of the IDT 102, determined by the thickness and material of electrodes 150 and 170, can be designed such that the frequency difference between the $k_\parallel=0$ frequency of the electrode region's TE1 mode and the outside electrode region's TS2 mode is small. Without wishing to be bound by any particular theory, when the frequency difference between outside region's TS2 mode and electrode region's TE1 mode is small, the trapping range is large. More particularly, the $k_\parallel=0$ frequency of the outside region's TS2 mode can be 95%-99% of the electrode region's TE1 cutoff frequency. The frequency difference between the outside region's TS2 and outside region's TE1 modes' $k_\parallel=0$ frequencies is designed to be large, e.g. 5%-15%, for example 6.5% - 7.5%, of the electrode region's TE1 mode cutoff frequency.

According to certain embodiments of the present invention, the $k_\parallel=0$ frequency of the outside region's TS2 mode is greater than, or equal to 98%, or between 98% and 99.5%, or is 98.9% of the electrode region's TE1 cutoff frequency. Similarly, the frequency distance expressed as the frequency difference between electrode region TE1 and outside region TS2 $k_\parallel=0$ frequencies:

$$\frac{\text{electrode } TE1 - \text{outside } TS2}{\text{outside } TS2}$$

should be small, for example on the order of 1%. As an example, said frequency distance can be between 0.2% and 2.1%, or between 0.5% and 1.8%, or between .8% and 1.5%, or for example, 1.1%.

Figure 5:
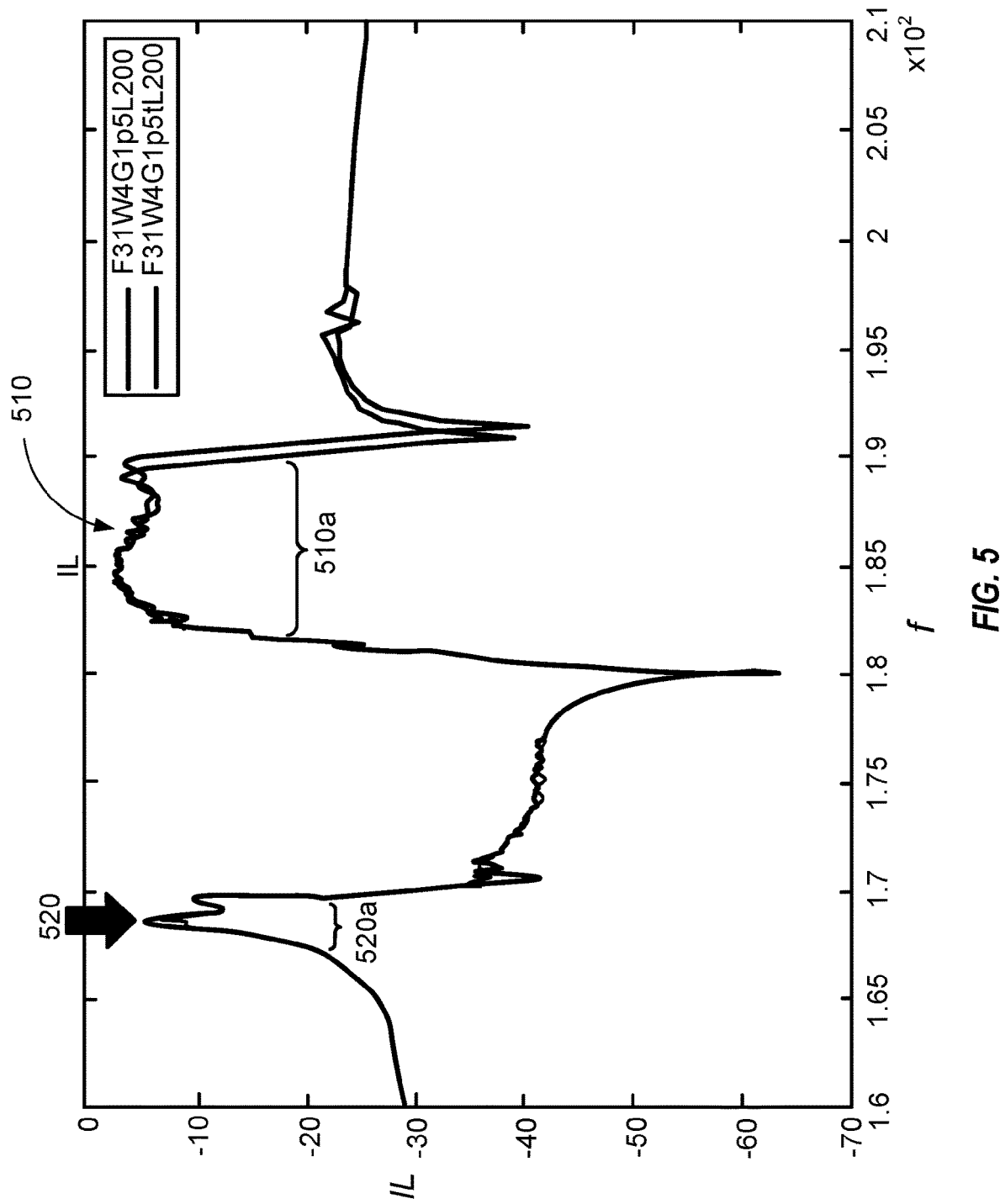
FIG. 5 is an experimental transmission curve of an LBAW as a function of frequency. FIGS.

FIG. 5 shows a curve of insertion loss IL versus frequency f for an exemplary LBAW 100. The curve shows two passbands with peak 510 corresponding to TE1 waves and peak 520 corresponding to TS2 waves. As discussed above, the width of each passband is determined by the frequency difference of the even and odd modes for the respective type of wave. Here, the TS2 modes correspond to sideband 520a (also referred to herein as "TS2 passband"), and the TE1 modes correspond to passband 510a (also referred to herein as "TE1 passband"). In some embodiments, LBAW 100 is designed to suppress peak 520 corresponding to TS2 modes, while maintaining the properties of peak 510 corresponding to TE1 modes. Without wishing to be bound by any particular theory, TE1 mode operation can be selected because piezo thin film materials have electromechanical coupling that is stronger in the thickness direction. In other words, TE1 longitudinal mode vibrations couple more efficiently to the electrical excitation over the thickness of piezo layer 110.

In some embodiments, LBAW 100 can be designed to have a passband for TE1 modes between 0.5 and 10 GHz, or between 1 and 4 GHz. In some examples, TE1 passband is between 1.8 and 3.7 GHz. The limits of the passband can incorporate design considerations. For example, the dimensions of the device can grow very large or very small. Too large dimensions may take too much space and cause inefficiencies. Too small dimensions can deteriorate performance due to thin and narrow electrodes leading to resistance and losses. In some embodiments, LBAW 100 can be designed to have a TE1 passband width 510a of 0.5-15% relative to center frequency, e.g., 10% relative to center frequency, or 5%, or 2%, or 1%. In some embodiments, the insertion loss at the passband is -7 dB to -0.5 dB or -5 dB to -1.5 dB.

Implementations of the present disclosure provides techniques to suppress spurious transmission peaks in cascaded LBAW filters. In some implementations, the cascaded LBAW filters can also be designed to have different TS2 resonance frequencies so that insertion loss of one filter suppresses sideband of the other filter.

FIGS. 6A-6E illustrate an example filter device 600 that includes two LBAW filters connected in series. FIGS. 6B, 6C, 6D and 6E illustrate cross sectional views of the filter device 600 illustrated in FIG. 6A.

The filter device 600 includes a first LBAW 100a connected to a second LBAW 100b. Each of the first and the second LBAWs 100a and 100b can be structurally similar to LBAW 100 of FIG. 1A or 1B, except as described below. For example, the first LBAW 100a includes an input electrode 150a with extensions 154a projecting from a common electrode portion 152a, and an output electrode 170a with extensions 174a projecting from a common electrode portion 172a. The electrodes extensions 154a and 174a of the first LBAW 100a extend substantially in parallel and are separated from each other by a first gap.

Similarly, the second LBAW 100b includes an input electrode 150b with extensions 154b projecting from a common electrode portion 152b, and an output electrode 170b with extensions 174b projecting from a common electrode portion 172b. The electrodes extensions 154b and 174b of the second LBAW 100b extend substantially in parallel and are separated from each other by a second gap.

The output electrode 170a of the first LBAW 100a is electrically connected to the input electrode 150b of the second LBAW 100a. In effect, the output electrode 170a of the first LBAW 100a serves as the input electrode 150b of the second LBAW 100b, and vice versa. The electrodes 170a and 150b (and any electrical connection if present) can form a common floating electrode 602 between the input electrode 150a of the first LBAW 100a and the output electrode 170b of the second LBAW 100b.

The first LBAW 100a includes a first counter-electrode 120a positioned below at least the extensions 150a, 170a of the first LBAW. Similarly, the second LBAW 100b includes a second counter-electrode 120b positioned below at least the extensions 150b, 170b of the second LBAW. The first counter electrode 120a and the second counter electrode 120b are not galvanically electrically connected. For example, the first counter electrode 120a and the second counter electrode 120b can be laterally separated by a dielectric material 122. The electrical connection between the first counter electrode 120a and second counter electrode 120b can be made through a capacitor.

The first and the second LBAWs 100a and 100b are configured such that application of a radio frequency voltage between the input electrode 150a of the first LBAW 100a and the first counter electrode 120a creates acoustic thickness-extensional (TE) and acoustic thickness-shear (TS) resonance modes between the electrodes 150a and 170a (e.g., in a first portion 110a of the first piezoelectric layer 110) of the first LBAW 100a. These vibrations results in a voltage between the first counter-electrode 120a and the output electrode 174a of the first LBAW 100a. Due to the electrical coupling between the output electrode 174a of the first LBAW 100a and the input electrode 150b of the second LBAW 100b, a radio frequency voltage is applied between the input electrode 150b of the second LBAW 100b and the second counter electrode 120b. This creates acoustic thickness-extensional (TE) and acoustic thickness-shear (TS) resonance modes between the electrodes 150b and 170b (e.g., in a second portion 110b of the first piezoelectric layer 110) of the second LBAW 100b. These vibrations results in a voltage between the second counter-electrode 120b and the output electrode 174b of the second LBAW 100b. Thus, the input electrode 150a of the first LBAW 100a provides the input for the filter device 600, whereas the output electrode 170b of the second LBAW 100b provides the output for the filter device 600.

Figure 7A:
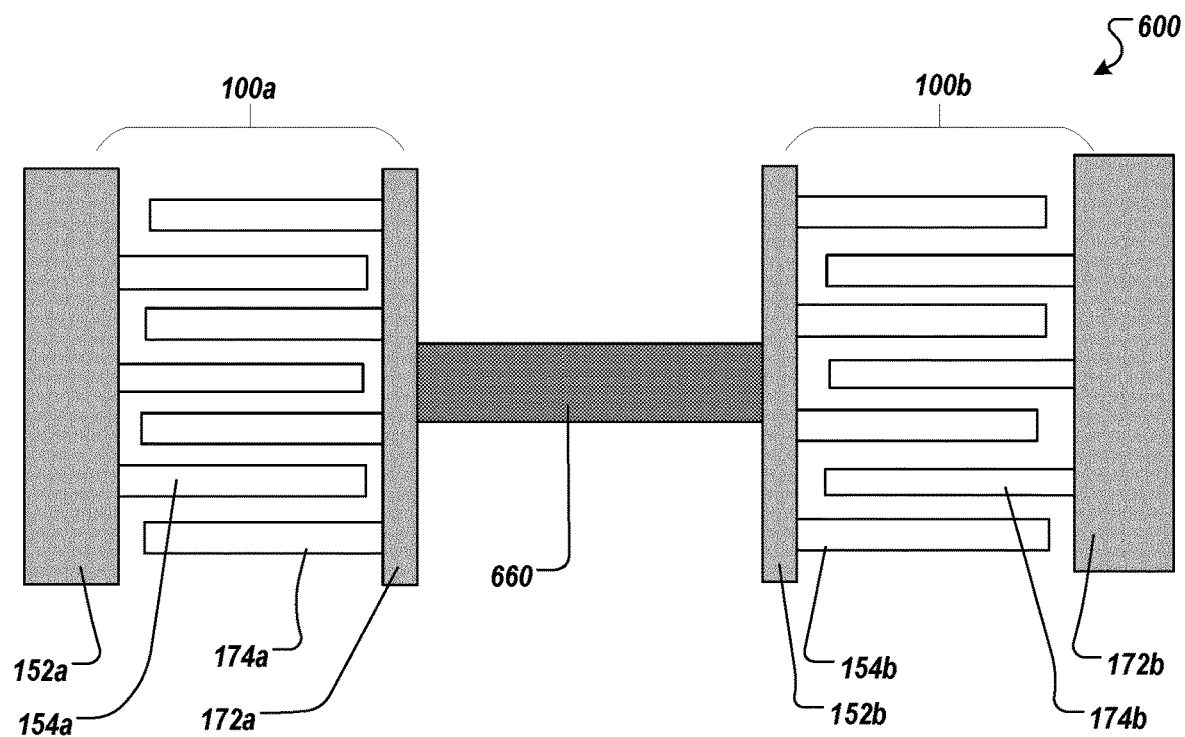
FIG. 7A a top view of another example filter device that includes two example LBAW filters connected in series.

As noted above, the output electrode 170a of the first LBAW 110a is electrically coupled with the input electrode 150b of the second LBAW 110b. In some embodiments, output electrode 170a is connected to the input electrode 150b through a conductive connector 660. FIG. 7A illustrates an examples of connection of electrodes 170a and 150b through the conductive connector 660. As shown in FIG. 7A, the conductive connector 660 can be an extended conductive body or conductive line, such that the first and second LBAWs 100a, 100b are separated by more than the width of a LBAW device. Although FIG. 7A illustrates the connector 660 as a straight line, this is not required. This permits effectively arbitrary placement of the LBAWs, which may be beneficial for layout of an integrated circuit.

The conductive connector 660 can have up to the same length as the electrodes 172a, 152b (measured along the long axis of the electrodes 172a, 152b, e.g., perpendicular to the long axis of the extensions 174a, 154b). The conductive connector 660 can have a length (again, measured along the long axis of the electrodes 172a, 152) that is greater than, less than, or the same as the width W of the extension 174a, 154b (see FIG. 1C). As shown in FIGS. 7A, the conductive connector 660 can have a length that is greater than the width of the extensions 174a, 154b. Electrodes 172a, 152b, and the conductive connector 660 together form a common electrode 602.

Alternatively, the conductive connector 660 can be relatively short such that the first and second LBAWs 100a, 100b are basically adjacent, e.g., separated by less than the width of a LBAW device on the substrate, or less than a width of an electrode 172a or 152b (width can be measured along the direction parallel to the long axis of the extensions).

Returning to FIG. 6A, the input electrode 150a of the first LBAW 100a and the output electrode 170b of the second LBAW 100b can directly abut. In this case, the filter device could be considered to have no conductive connector 660 (or the conductive connector could be considered integrated as part of the conductive region that provides the common electrode portion 172a and 152b).

Figure 7B:
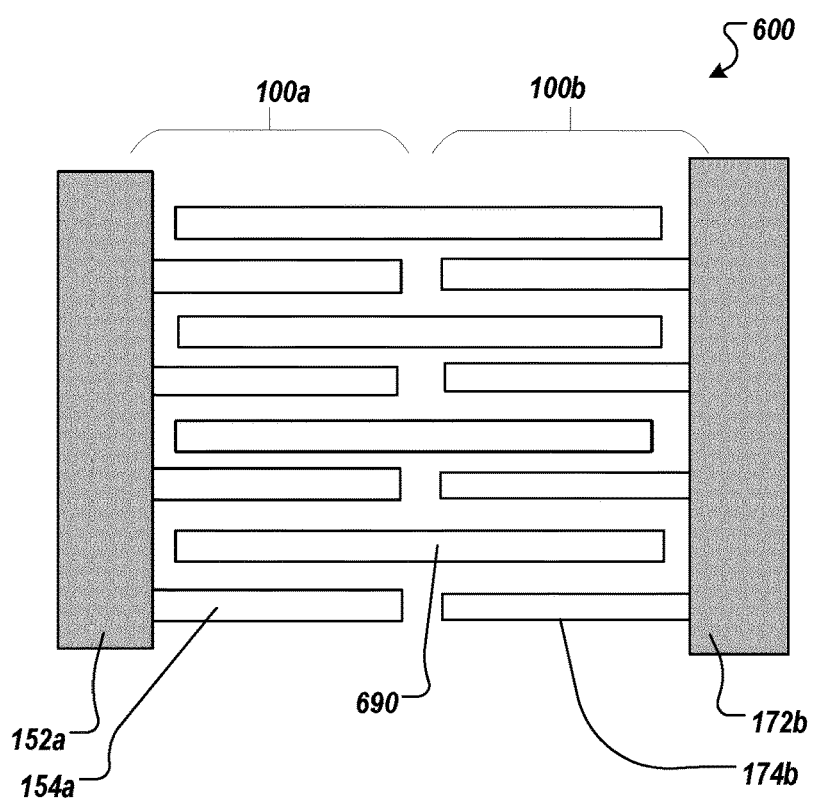
FIG. 7B a top view of another example filter device that includes two example LBAW filters connected in series.

In some embodiments, the common floating electrode 602 consists of individual fingers; the fingers do not extend from a conductive base and need not be electrically connected. FIG. 7B illustrates an example filter device with multiple common electrodes between its two LBAWs 100a and 100b. The individual fingers 690 can be conductively separated from each other. The fingers can be interdigitated with the extensions (154a, 174b) of the electrodes (150a, 170b) of the two LBAWs 100a and 100b.

Referring back to FIG. 6A, the common electrode portions 152a, 172a of the first LBAW 100a can be rectangular bodies, and can extend substantially in parallel (i.e., their long axes are substantially parallel). Similarly, the common electrode portions 152b, 172b of the second LBAW 100b can be rectangular bodies, and can extend substantially in parallel (i.e., their long axes are substantially parallel). However, opposing electrodes (as parts of one LBAW or as parts of the common electrode 602) can have similar or different shapes and/or dimensions and/or orientations.

Each of the electrodes 150a, 170a, 150b, 170b includes two or more extensions 154a, 174a, 154b, 174b, respectively. The extensions extend from and are spaced along the length of the respective common electrode portions 152a, 172a, 154b, 174b. The extensions 154a, 174a of the first LBAW 100a may be substantially in parallel (e.g., form an angle less than 5 degrees) to the extensions 154b, 174b of the second LBAW 100b. A first set (or all) of extensions of the first LBAW 100a may be arranged so that the first set of extensions form an angle greater than zero (e.g., greater than 5 degrees) with respect to a second set (or all) of extensions of the second LBAW 100b (i.e., be not in parallel).

In each of the first and the second LBAWs 100a, 100b, each of the extensions can be part of a comb-shape structure extending from the respective electrode. The comb structure that extends from a first electrode (e.g., electrode 150a) can be interdigitated with the comb structure that extends from a second electrode (e.g., electrode 170a) that is opposite the first electrode. Each comb structure can include two or more extensions. Extensions of a comb structure can be in parallel with each other. Extensions of two integrated comb structures are separated by a gap. Extensions of a first comb structures can be in parallel with the extensions of a second comb structure that is integrated with the first comb structure. For examples, extensions 154b can be in parallel with extensions 174b of the second LBAW 100b.

Figure 6A:
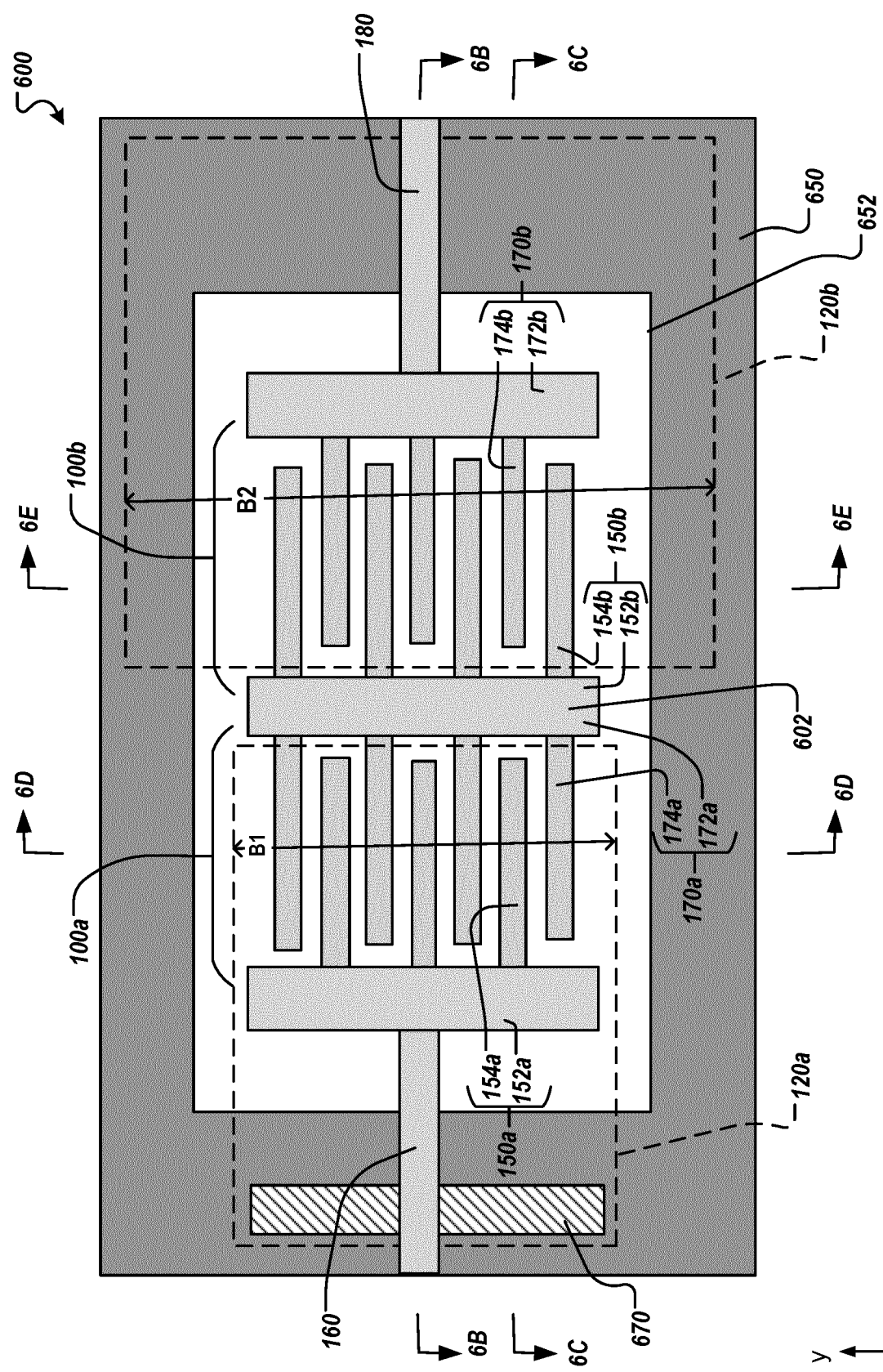
FIG. 6A is a top view of an example filter device that includes two example LBAW filters connected in series.

The two LBAWs 100a, 100b, can have the same or different number of extensions (e.g., K can be the same for both LBAWs). For example, as shown in FIGS. 6A, 7A and 7B, the comb structures associated with electrodes 150a and 170b have the same number of extensions, and the comb structures associated with electrodes 170a and 150b have the same number of extensions, so that the total number of extensions is the same for both LBAWs 100a, 100b.

Two interdigitated comb structures within an LBAW can have the same or different number of extensions. For example, as shown in FIG. 6A, the comb structure associated with electrode 150a has a different number of extensions from the comb structure associated with the electrode 170a.

Rather than two comb structures, a filter device may include a first electrode that provides a comb structure with multiple extensions, and a second electrode that includes a single bar-shaped conductive body (e.g., a single extension) extending between the extensions of the comb. The comb structure is integrated by the bar extension.

The electrodes 150a, 170a, 150b, 170b can be composed of the same or different materials. The extensions 154a, 174a, 154b, 174b can be composed of the same or different materials. One or more electrodes and one or more extensions can be composed of the same or different materials. In some examples, the extensions and the electrodes are composed of one or more metals, such as aluminum (Al).

Returning to FIGS. 6A-6E, an annular electrode 650 is disposed on the top surface of the piezoelectric layer 110. An aperture 652 is formed through the annular electrode 650, and the input and output electrodes 150a, 170a, 150b, 170b are positioned in the aperture. Thus, the first and second LBAW devices 100a, 100b are surrounded by the annular electrode 650. By grounding the annular electrode 650, vibrations can be suppressed, thus reducing cross-talk between different filter devices 600 on the same substrate.

In some implementations, only those LBAW devices that are cascaded to form a particular filter device are positioned in the aperture 652. For example, if multiple cascaded filters devices are to be fabricated on a die, each cascaded filter device (each having two or more LBAW devices connected in series) can be positioned in its own aperture. A separate annular electrode could be provided for each cascaded filter device, or a common electrode with multiple apertures therein could be used with each cascaded filter device in a different aperture.

In some implementations, the annular electrode 650 completely surrounds the input and output electrodes 150a, 170a, 150b, 170b, e.g., without a gap. However, in some implementations, some gaps can be present while still reducing cross-talk between the different filter devices 600. The aperture 652 through the annular electrode 650 can be rectangular, but other shapes, e.g., circular, can be suitable.

The annular electrode 650 can be deposited in the same step that forms the electrodes 150a, 170a, 150b, 170b, and thus be of the same material composition as those electrodes. The input port 160 and output port 180 can be formed by conductive layers deposited over the annular electrode 650 (see FIG. 6B). The input port 160 and output port 180 can be electrically isolated from the annular electrode 650, e.g., by a dielectric layer 606.

The counter-electrode of one of the LBAWs can be galvanically electrically coupled to the annular electrode 650 so that both are maintained at essentially the same voltage. The electrical connection between the counter electrode and the annular electrode can be provided by an electrical via 670 that extends through the piezoelectric layer 110. In contrast, the counter-electrode of another of the LBAWs can be capacitively electrically coupled to the annular electrode 650.

Figure 6B:
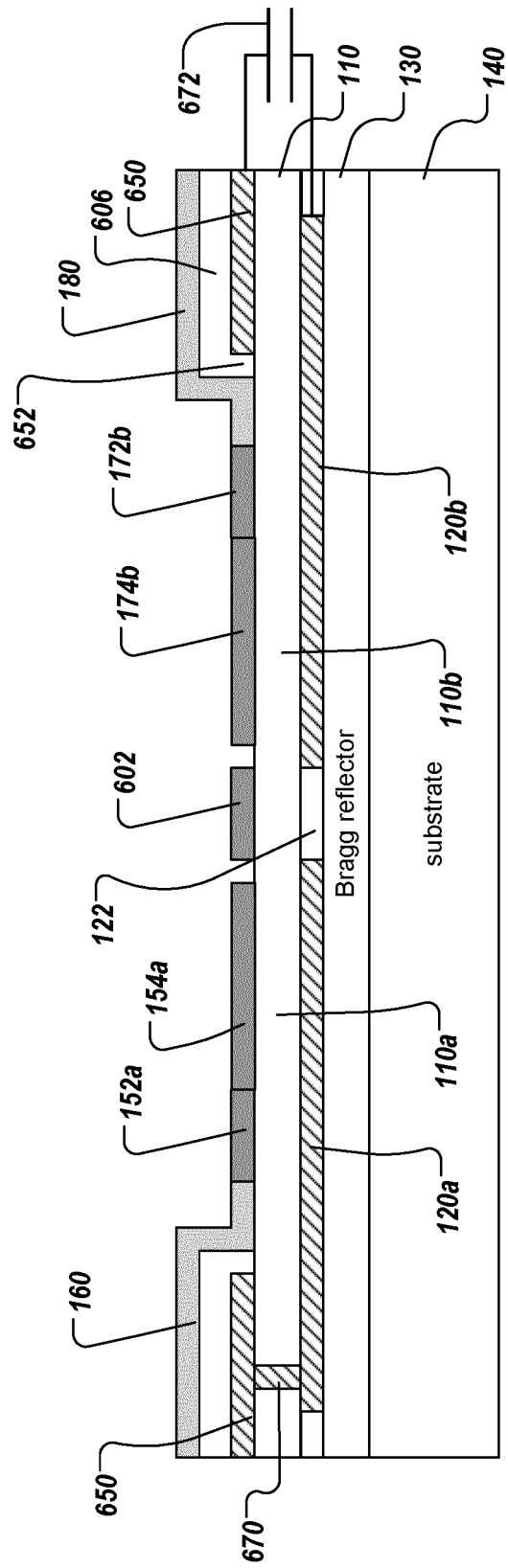
FIG. 6B is a cross-sectional side view of the example filter device of FIG. 6A along line 6B-6B.
Figure 6C:
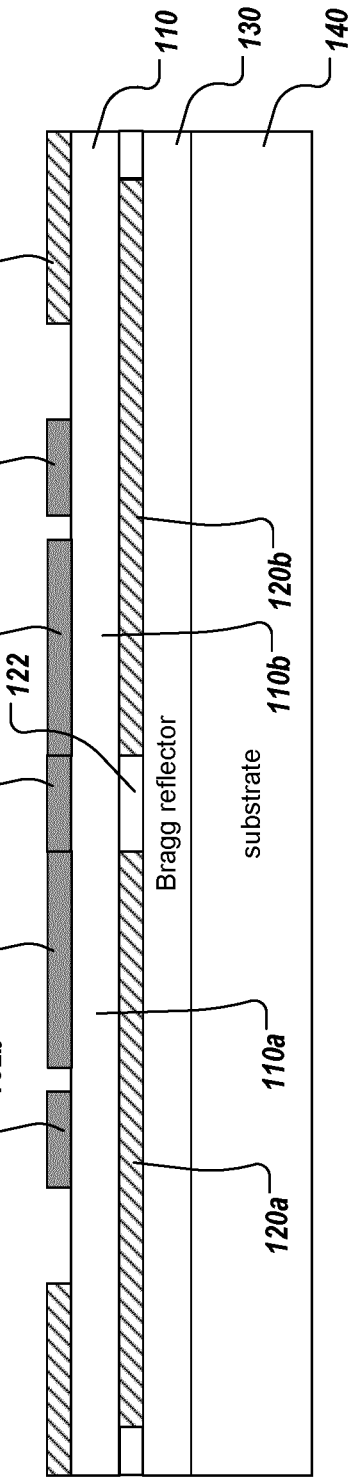
FIG. 6C is a cross-sectional side view of the example filter device of FIG. 6A along line 6C-6C.

For example, as illustrated in FIG. 6B, the first counter electrode 120a of the first LBAW 100a can be galvanically electrically connected to the annular electrode 650, e.g., by an electrical via 670 that extends through the piezoelectric layer 110.

In contrast, the second counter electrode 120b of the second LBAW 100b is electrically coupled to the annular electrode 650 through a capacitor 672. The capacitor 672 can be fabricated on the same die as the filter device, e.g., from two conductive layers separated by a dielectric layer of thickness sufficient to provide a desired capacitance. Alternatively, the capacitor 672 could be provided by a discrete capacitor on a circuit board. The capacitor 672 can be electrically coupled to the first counter electrode 120b by a conductive lead fabricated in the layer of the counter electrode 120, and can be electrically coupled to the annular electrode 650 by a conductive lead fabricated on the piezoelectric layer. The capacitor 672 can have a capacitance of 10 to 50 pF, e.g., 30 to 40 pF, or 33 pF.

In addition, the first counter electrode 120a and the second counter electrode 120b can have different lateral dimensions. For example, the first counter electrode 120a can have a breadth B1 along a breath direction that is perpendicular to the longitudinal axis of the extensions 154a, 174a. The second counter electrode 120b can have a breadth B2 along a breadth direction perpendicular to the longitudinal axis of the extensions 154b, 174b. Assuming all the extensions are parallel, these dimension are along the y-axis. The breadth B1 is different, e.g., smaller, than the breadth B2.

In particular, one of the counter electrodes 120a, 120b can extend (along the breadth direction) below the annular electrode 650. In contrast, another of the counter electrodes 120a, 120b does not extend (along the breadth direction). Both of the counter electrodes 120a, 120b can extend below the annular electrode 650 along the length direction of their respective extensions.

Figure 6D:
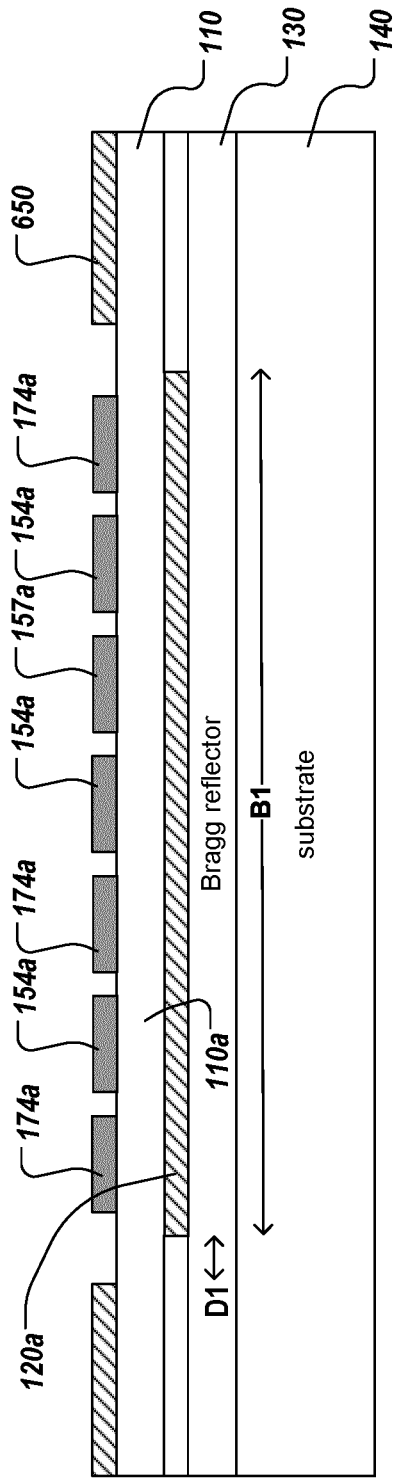
FIG. 6D is a cross-sectional side view of the example filter device of FIG. 6A along line 6D-6D.

For example, as shown by FIGS. 6A and 6D, the first counter-electrode 120a does not extend along its breadth direction below the annular electrode 650. Rather, the first counter-electrode 120a is laterally separated along its breadth direction from the annular electrode 650 by a gap with a width D1.

Figure 6E:
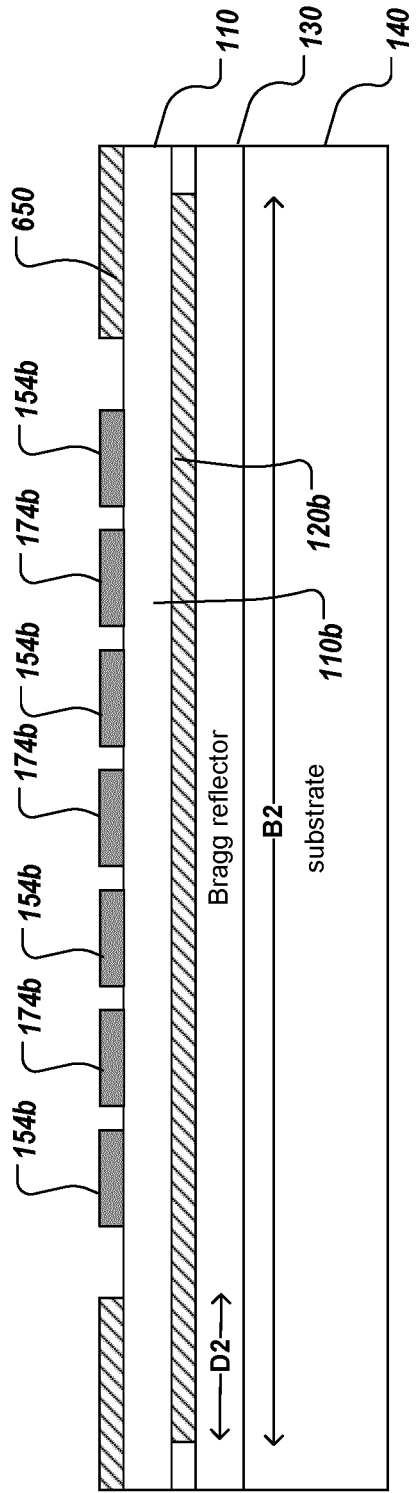
FIG. 6E is a cross-sectional side view of the example filter device of FIG. 6A along line 6E-6E.

In contrast, as shown by FIGS. 6A and 6E, the second counter-electrode 120b does extend along its breadth direction below the annular electrode 650. The second counter-electrode 120b can extend along its breadth below the annular electrode 650 by a distance D2.

As shown in FIGS. 6B-6E, the reflector 130 can be a common reflector, e.g., a common Bragg reflector, shared between the first and the second LBAWs 100a and 100b. Alternatively, the first and the second LBAWs 100a and 100b could be provided with separate reflectors, e.g., there could be separate recesses disposed below the first and the second LBAWs 100a and 100b.

As shown in FIGS. 6B-6E, the piezoelectric layer 110 can be shared between the first and the second LBAWs 100a and 100b. Alternatively, the first and the second LBAWs 100a and 100b could be provided with separate piezoelectric layers, e.g., the piezoelectric layers could be laterally separated by a gap or non-piezoelectric material.

Cascaded LBAWs can be utilized to suppress spurious sidebands created by TS modes. For example, the filter device 600 may have a sideband that is a result of sidebands of the first and the second LBAWs 100a and 100b. The first LBAW 100a and/or the second LBAW 100b can be utilized to suppress the sideband of embodiment 600 to have a lower signal transmission compared to the individual ones of LBAW 100a and 100b.

Figure 8A:
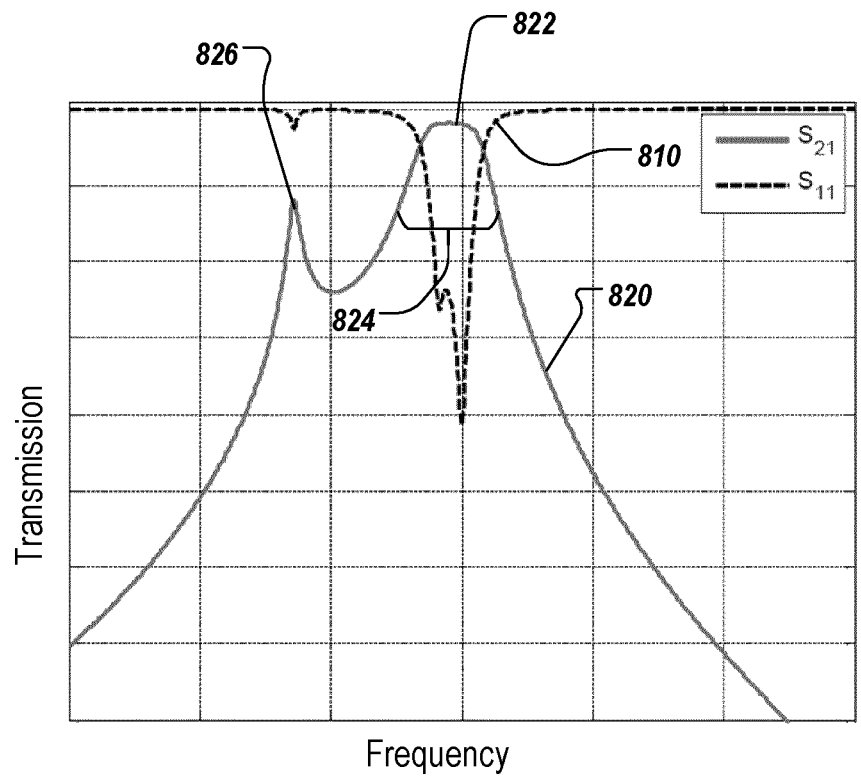
FIG. 8A depicts transmission curves of two LBAWs connected in series.
Figure 8B:
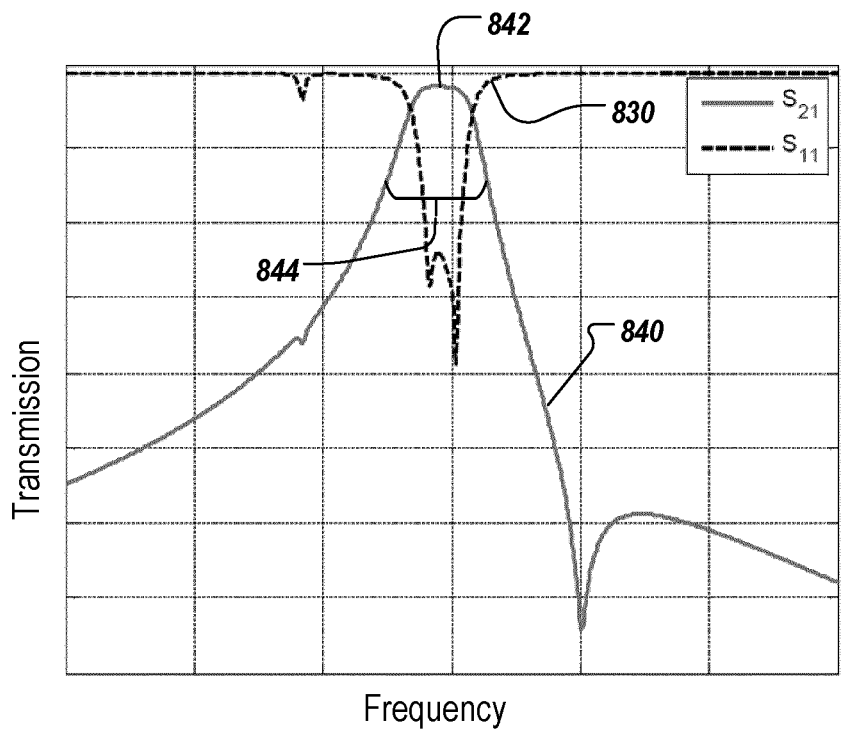
FIG. 8B depicts transmission curves of two LBAWs connected in series and using the subject matter described in this specification.

FIGS. 8A and 8B depict the S11 and S21 transmission curves for two example filter devices that use cascaded LBAWs. FIG. 8A shows an S11 transmission curve 810 and an S21 transmission curve 820 for a filter device that includes two LBAW filters connected in series and is similar to the filter device 600, but in which the counter electrodes under both LBAW filters are galvanically electrically connected to the annular electrode. The S21 transmission curve 820 includes both a main transmission peak 822 that provides a pass band 824, and a spurious transmission peak 826 below the pass band 824 frequency.

FIG. 8B shows an S11 transmission curve 830 and an S21 transmission curve 840 for the filter device 600, i.e., that includes two LBAW filters connected in series with the counter electrode 110a of one LBAW filter 100a having a galvanic coupling to the annular electrode 650, but the counter electrode 110b of the other LBAW filter 100b having a capacitive coupling to the annular electrode 650. The S21 transmission curve 840 includes a main transmission peak 842 that provides a pass band 844. However, the capacitive coupling suppresses the spurious peak.

A number of implementations have been described. Nevertheless, it will be understood that various modifications may be made without departing from the spirit and scope of disclosure. Accordingly, other implementations are within the scope of the following claims.

What is claimed is:

1. An acoustic wave filter device comprising:
   a first acoustic wave filter element comprising a first input electrode, a first output electrode, and a first counter electrode,
      wherein the first input electrode and the first output electrode are located on a top surface of a piezoelectric layer, and the first counter electrode is located on a bottom surface of the piezoelectric layer;
   a second acoustic wave filter element comprising a second input electrode, a second output electrode, and a second counter electrode,
      wherein the second input electrode and the second output electrode are located on the top surface of the piezoelectric layer, and the second counter electrode is located on the bottom surface of the piezoelectric layer, the second counter electrode being electrically separated from the first counter electrode; and
   a common floating electrode that electrically connects the first output electrode to the second input electrode, so that the first input electrode and the first counter electrode form an input resonator of the acoustic wave filter, and the second output electrode and the second counter electrode form an output resonator of the acoustic wave filter,
   wherein the acoustic wave filter has only one input resonator for applying an input voltage to the device, and one output resonator for obtaining output voltage from the device.

2. The device of claim 1, wherein the first output electrode comprises one or more first extensions, and the second input electrode comprises one or more second extensions, and
   wherein each of the first extensions and each of the second extensions are connected to the common floating electrode at a respective end of the corresponding extension.

3. The device of claim 1, wherein the first output electrode and the second input electrode include one or more common extensions, the one or more common extensions being interdigitated with one or more extensions of the first input electrode and one or more extensions of the second output electrode.

4. The device of claim 1, wherein each of the first input electrode and the first output electrode includes multiple first extensions, first extensions of the first input electrode being interdigitated with first extensions of the first output electrode.

5. The device of claim 4, wherein each of the second input electrode and the second output electrode includes multiple second extensions, second extensions of the second input electrode being interdigitated with second extensions of the second output electrode.

6. The device of claim 5, wherein each of the first input electrode and the first output electrode is a first comb structure having the multiple first extensions and wherein each of the second input electrode and the second output electrode is a second comb structure having the multiple second extensions.

7. The device of claim 1, wherein the common floating electrode is a electrically isolated from each of the first input electrode and the second output electrode.

8. The device of claim 1, wherein the first counter electrode is electrically separated from the second counter electrode by a dielectric material located on the bottom surface of the piezoelectric layer and under the common floating electrode.

9. The device of claim 1, further comprising a first acoustic reflector for the first acoustic wave filter element, and a second acoustic reflector for the second acoustic wave filter element, wherein the first acoustic reflector and the second acoustic reflector are provided by a common Bragg reflector.

10. The device of claim 1, wherein a radio frequency voltage between the first input electrode and the first counter electrode creates second-order acoustic thickness-shear (TS2) resonance mode in the piezoelectric layer between the first input electrode and the first output electrode and between the second input electrode and the second output electrode.

11. The device of claim 1, wherein the first counter electrode has a different size from the second counter electrode.

12. The device of claim 1, further comprising: an annular electrode located on the top surface of the piezoelectric layer,
   wherein at least the first input electrode, the first output electrode, the second input electrode, the second output electrode, and the common floating electrode are surrounded by the annular electrode.

13. The device of claim 1, wherein the common floating electrode connects the first output electrode to the second input electrode such that an application of a radio frequency voltage between the first input electrode and the first counter electrode results in a radio frequency voltage being formed between the second input electrode and the second counter electrode.

* * * * *